United States Patent
Liu

(10) Patent No.: US 10,707,134 B2
(45) Date of Patent: Jul. 7, 2020

(54) FIN FIELD-EFFECT TRANSISTOR AND FABRICATION METHOD THEREOF

(71) Applicants: Semiconductor Manufacturing International (Shanghai) Corporation, Shanghai (CN); Semiconductor Manufacturing International (Beijing) Corporation, Beijing (CN)

(72) Inventor: Ji Quan Liu, Shanghai (CN)

(73) Assignees: Semiconductor Manufacturing International (Shanghai) Corporation, Shanghai (CN); Semiconductor Manufacturing International (Beijing) Corporation, Beijing (CN)

( * ) Notice: Subject to any disclaimer, the term of this patent is extended or adjusted under 35 U.S.C. 154(b) by 0 days.

(21) Appl. No.: 15/810,398

(22) Filed: Nov. 13, 2017

(65) Prior Publication Data

US 2018/0144987 A1 May 24, 2018
US 2018/0374755 A9 Dec. 27, 2018

(30) Foreign Application Priority Data

Nov. 14, 2016 (CN) .......................... 2016 1 0999686

(51) Int. Cl.
*H01L 21/8234* (2006.01)
*H01L 29/66* (2006.01)
(Continued)

(52) U.S. Cl.
CPC ............... *H01L 21/823481* (2013.01); *H01L 21/823431* (2013.01); *H01L 21/823437* (2013.01);
(Continued)

(58) Field of Classification Search
CPC .......... H01L 21/823481; H01L 29/785; H01L 29/66795; H01L 21/823431;
(Continued)

(56) References Cited

U.S. PATENT DOCUMENTS

| 9,552,978 B1* | 1/2017 | Huang | H01L 21/02164 |
| 2001/0036705 A1* | 11/2001 | Nishida | H01L 21/76229 |
| | | | 438/296 |

(Continued)

FOREIGN PATENT DOCUMENTS

| CN | 102074572 A | 5/2011 |
| CN | 104517891 A | 4/2015 |
| TW | 201434108 A | 9/2014 |

OTHER PUBLICATIONS

The European Patent Office (EPO) The Extended European Search Report for 17201310.4 dated Apr. 6, 2018 7 Pages.

*Primary Examiner* — David Vu
(74) *Attorney, Agent, or Firm* — Anova Law Group, PLLC

(57) ABSTRACT

FinFET structures and fabrication methods thereof are provided. An exemplary fabrication method includes forming a semiconductor substrate and a plurality of fins. First trenches and second trenches are formed between adjacent fins, and a width of the first trench is greater than a width of the second trench. The method also includes forming a first isolation layer on the semiconductor substrate exposed by the fins and on side surfaces of the fins. The first isolation layer containing an opening at the first trench. Further, the method also includes performing a first thermal annealing; forming a second isolation layer to fill the opening; removing a partial thickness of the first isolation layer and a partial thickness of the second layer to form an isolation structure;

(Continued)

forming a gate structure across the plurality of fins; and forming doped source/drain regions in the fins at two sides of the gate structure.

16 Claims, 7 Drawing Sheets

(51) Int. Cl.
*H01L 29/78* (2006.01)
*H01L 27/088* (2006.01)
*H01L 29/06* (2006.01)

(52) U.S. Cl.
CPC ...... *H01L 27/0886* (2013.01); *H01L 29/0653* (2013.01); *H01L 29/66795* (2013.01); *H01L 29/785* (2013.01); *H01L 29/7846* (2013.01)

(58) Field of Classification Search
CPC ......... H01L 27/0886; H01L 21/823437; H01L 29/0653; H01L 29/7846
See application file for complete search history.

(56) References Cited

U.S. PATENT DOCUMENTS

| | | | |
|---|---|---|---|
| 2011/0095372 A1* | 4/2011 | Yuan | ................ H01L 21/76229 257/368 |
| 2014/0231919 A1 | 8/2014 | Peng et al. | |
| 2014/0252497 A1 | 9/2014 | Peng et al. | |
| 2015/0099342 A1* | 4/2015 | Tsai | ................ H01L 21/76237 438/400 |

* cited by examiner

FIN FIELD-EFFECT TRANSISTOR AND FABRICATION METHOD THEREOF

CROSS-REFERENCES TO RELATED APPLICATIONS

This application claims the priority of Chinese patent application No. 201610999686.9, filed on Nov. 14, 2016, the entirety of which is incorporated herein by reference.

FIELD OF THE DISCLOSURE

The present disclosure generally relates to the field of semiconductor manufacturing technologies and, more particularly, relates to fin field-effect transistors (FinFETs) and fabrication methods thereof.

BACKGROUND

In manufacturing semiconductor devices for integrated circuits (ICs), especially for very-large-scale-integration (VLSI), the critical dimension (CD) of IC devices has become smaller and smaller. Accordingly, the channel length of the MOSFET device has been reduced. However, with the continuous reduction of the channel length, the distance between the source region and the drain region of the device has been reduced as well. As a result, the control ability of the gate structure of the MOSFET device on the channel region becomes weaker, and it is more difficult for the gate structure to pinch off the channel region. Thus, the sub-threshold leakage phenomenon, i.e., the short-channel effects (SCEs), is easy to occur.

Thus, to better adapt the reduction of the CD, the semiconductor technologies have gradually transformed from planar MOSFET transistors to three-dimensional transistors that have better performances. FinFET transistors are a type of three-dimensional transistors. The gate of an FinFET is able to control the ultra-thin components (i.e., fins) from at least two sides. Comparing with the planar MOSFET device, the control ability of the gate on the channel region of the FinFET may be increased. Thus, the short-channel effect is effectively reduced.

However, it is desirable to further improve the electrical properties of conventional FinFETs. The disclosed methods and semiconductor structures are directed to solve one or more problems set forth above and other problems in the art.

BRIEF SUMMARY OF THE DISCLOSURE

One aspect of the present disclosure includes a method for fabricating an FinFET structure. The method includes forming a semiconductor substrate and a plurality of fins by etching a base substrate, wherein first trenches and second trenches are formed between adjacent fins, and a width of the first trenches is greater than a width of the second trenches; forming a first isolation layer on a surface of the semiconductor substrate exposed by the fins and on side surfaces of the fins, wherein the first isolation layer in the first trench contains an opening; performing a first thermal annealing process on the first isolation layer; forming a second isolation layer to fill the opening and cover the first isolation layer; removing a partial thickness of the first isolation layer and a partial thickness of the second layer to form an isolation structure; forming a gate structure across the plurality of fins by covering side and top surfaces of the plurality of fins; and forming doped source/drain regions in the fins at two sides of the gate structure.

Another aspect of the present disclosure includes an FinFET structure. The FinFET structure includes a semiconductor substrate; a plurality of fins formed on the semiconductor substrate, wherein first trenches and second trenches are formed between adjacent fins and a width of the first trench is greater than a width of the second trench; and a first isolation layer, formed on the semiconductor substrate exposed by the plurality of fins and on side surfaces of the fins, wherein the first isolation layer in the first trench contains an opening filled with a second isolation layer.

Other aspects of the present disclosure can be understood by those skilled in the art in light of the description, the claims, and the drawings of the present disclosure.

DETAILED DESCRIPTION

Reference will now be made in detail to exemplary embodiments of the disclosure, which are illustrated in the accompanying drawings. Wherever possible, the same reference numbers will be used throughout the drawings to refer to the same or like parts.

FIGS. 1-6 illustrate semiconductor structures corresponding to certain stages of a fabrication process of the FinFET structure.

Figure 1:
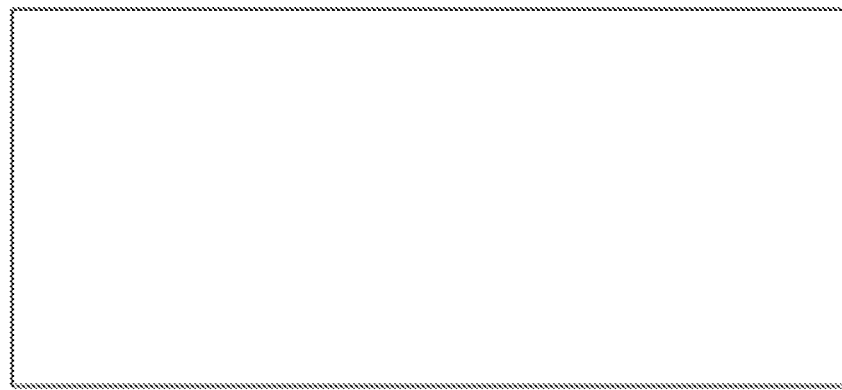
FIGS. 1-6 illustrate semiconductor structures corresponding to certain stages of a fabrication process of an FinFET structure.

As shown in FIG. 1, at the beginning of the fabrication process, a base substrate (not labeled) is provided.

Figure 2:
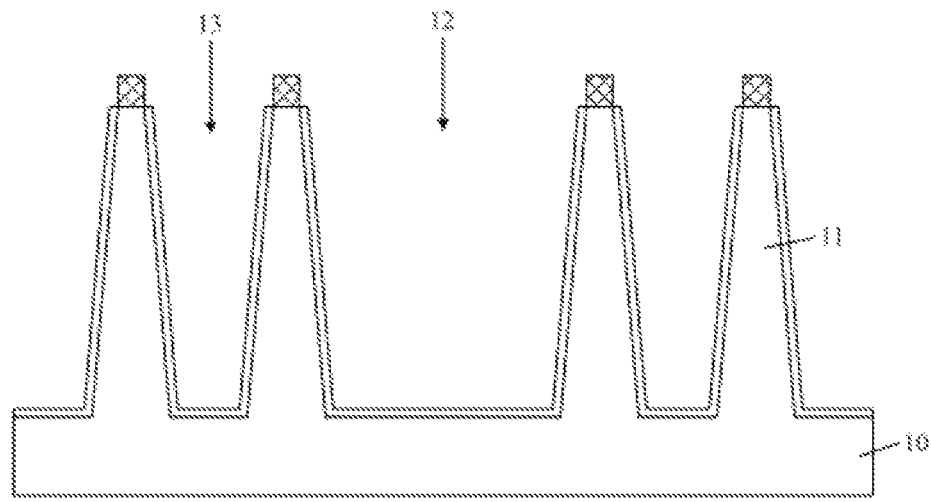

Further, as shown in FIG. 2, a semiconductor substrate 10 and a plurality of fins 11 are formed by etching the base substrate. The plurality of fins 11 are formed on the semiconductor substrate 10. First trenches 12 and second trenches 13 are formed between the adjacent fins 11 (i.e., the gaps among the fins are referred to as the first trenches and the second trenches). The first trenches 12 and the second trenches 13 may have different widths. The width of the first trenches 12 is greater than the width of the second trenches 13.

Figure 3:
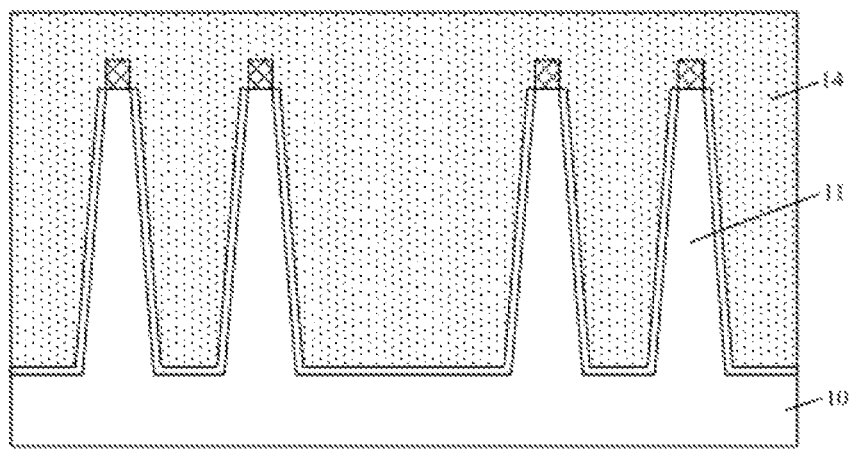

Further, as shown in FIG. 3, an isolation layer 14 may be formed on the semiconductor substrate 10 exposed by the fins 11. The isolation layer 14 may fill the first trenches 12 and the second trenches 13. The top surface of the isolation layer 14 is above the top surfaces of the fins 11.

Figure 4:
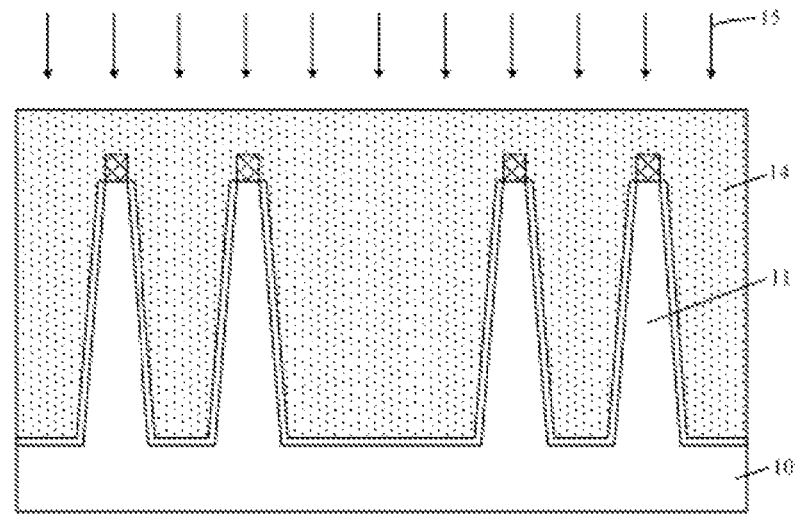

Further, as shown in FIG. 4, a thermal annealing process 15 is performed on the isolation layer 14.

Figure 5:
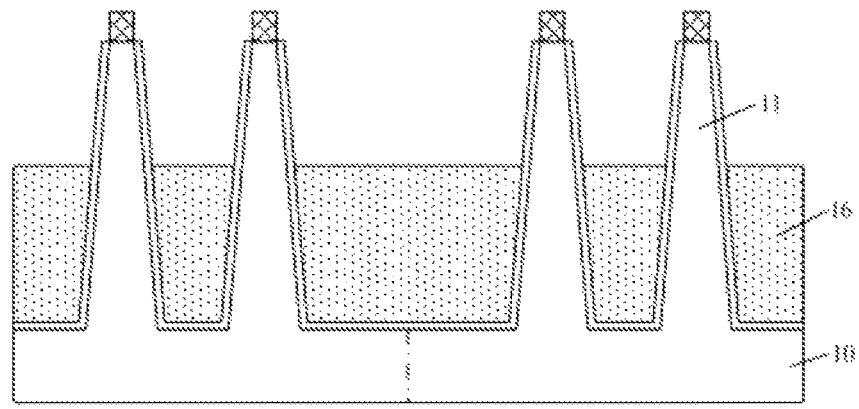

After the thermal annealing process 15, as shown in FIG. 5, a partial thickness of the isolation layer 14 may be removed; and an isolation structure 16 may be formed. The top surface of the isolation structure 16 may be below the top surfaces of the fins 11.

Figure 6:
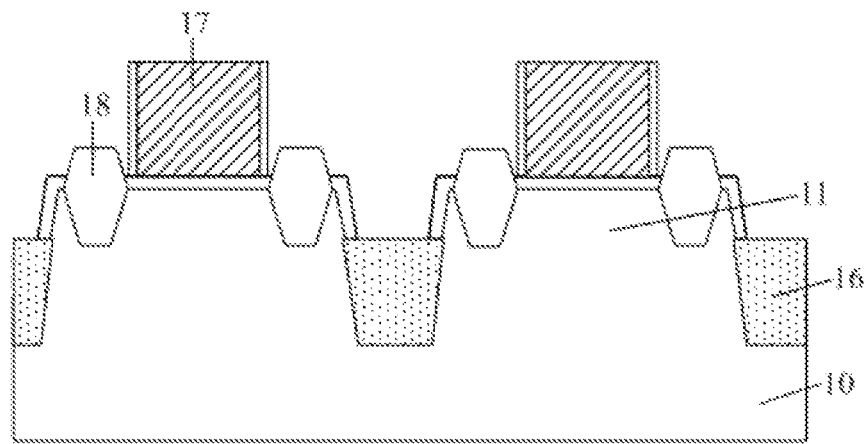

Further, after forming the isolation structure 16, as shown in FIG. 6, a gate structure 17 may be formed. The gate structure 17 may be across the fins 11 by covering portions of side and top surfaces of the fins 11. Then, doped source/drain regions 18 may be formed in the fins 11 at two sides of the gate structure 17.

In this case, a flowable chemical vapor deposition (FCVD) process is often used to form the isolation layer, then a thermal annealing process is performed to increase the strength and compactness of the isolation layer such that the removing rate and the uniformity of the subsequent process for removing the partial thickness of the isolation layer is easy to control. However, during the thermal annealing process, the isolation layer shrinks. Because the width of the first trenches is greater than the width of the second trenches, the filling amount of the isolation layer in the first trenches is greater than the filling amount of the isolation layer in the second trenches. Such a condition causes the isolation layer in the first trenches to have a larger shrinking amount than the isolation layer in the second trenches. The different shrinking amount is easy to cause the stresses at two sides of the fins to be non-uniform. Thus, the fins may be bent and/or deformed. Accordingly, the performance of the FinFET is severely affected.

The present disclosure provides an FinFET and a fabrication method thereof. The fabrication method of the FinFET may include providing a base substrate; and etching the base substrate to form a semiconductor substrate and a plurality of fins on the semiconductor substrate. First trenches and second trenches with different widths may be formed between adjacent fins. The width of the first trench may be greater than the width of the second trench. The method may also include forming a first isolation layer on the semiconductor substrate exposed by the fins. The first isolation layer may form openings at the first trenches. Further, the method may include performing a first thermal annealing process on the first isolation layer; and forming a second isolation layer to fill the openings and cover the first isolation layer. Further, the method may include removing a partial thickness of the first isolation layer and the second isolation layer to form an isolation structure with a top surface below the top surfaces of the fins; and forming a gate structure over the semiconductor substrate and across the fins by covering portions of the top and side surfaces of the fins; and forming doped source/drain regions in the fins at two sides of the gate structure.

In the disclosed fabrication method of the FinFET, by etching a base substrate, the semiconductor substrate may be formed; and the plurality of the fins may be formed on the semiconductor substrate. The trenches between adjacent fins may be referred to first trenches and second trenches. The width of the first trench may be greater than the width of the second trench. Then, the first isolation layer may be formed on the semiconductor substrate exposed by the fins; and the first isolation layer may form openings at the first trenches. Then, the first thermal annealing process may be performed on the first isolation layer; and a second isolation layer and an isolation structure may be formed. Because the filling amount in the first trench and the filling amount of the second trench may be substantially equivalent, the shrinkage difference between the first isolation layer in the first trenches and the first isolation layer in the second trenches may be substantially small during the first thermal annealing process. Further, the first thermal annealing process may reduce the stress in the first isolation layer; and improve the isolation property of the first isolation layer. Thus, the deformation possibility of the fins caused by the stress difference generated by the shrinking of the first isolation layer may be reduced. Accordingly, the performance of the FinFET structure may be improved.

Figure 19:
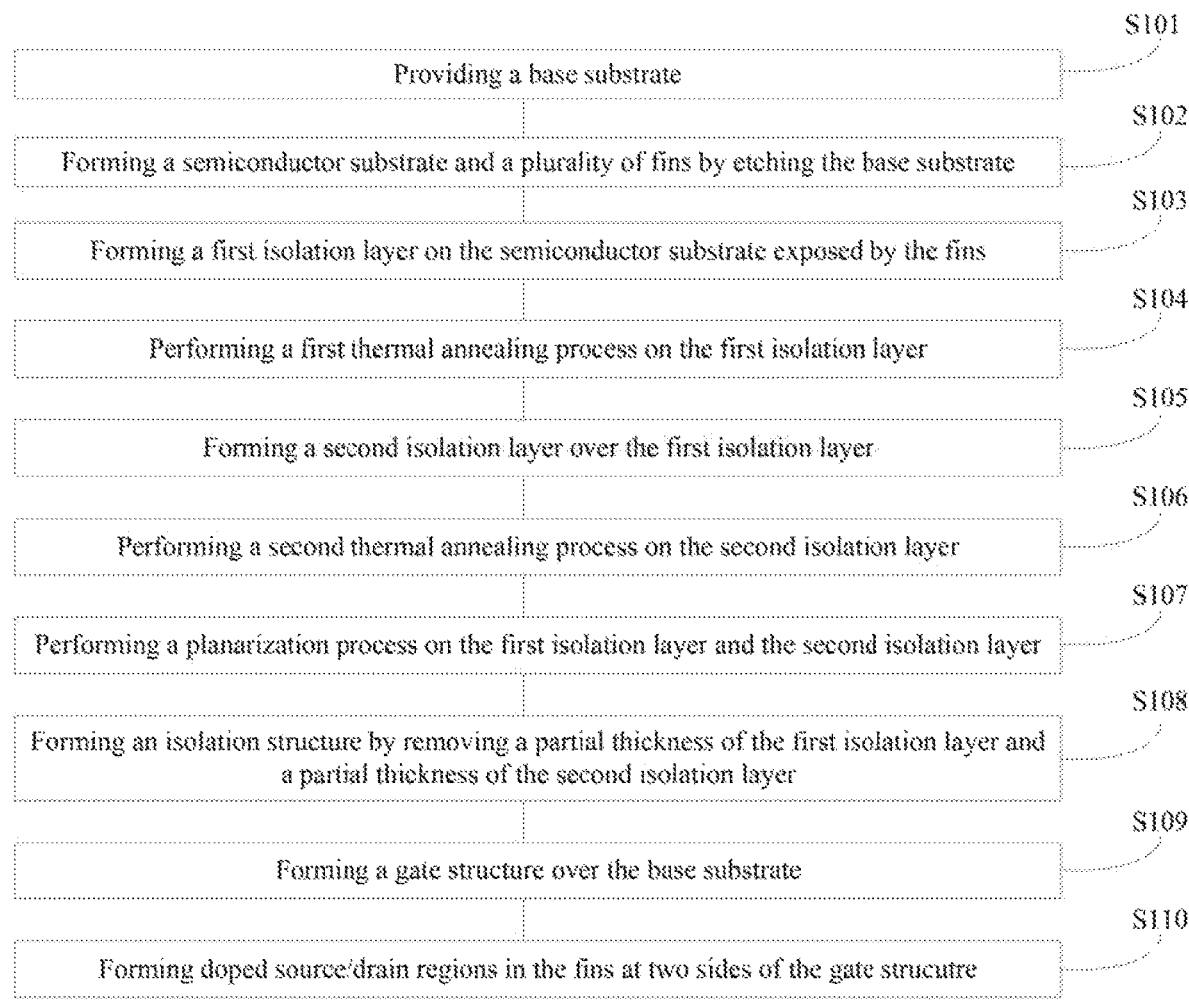
FIG. 19 illustrates an exemplary fabrication process of an FinFET structure consistent with the disclosed embodiments.

FIG. 19 illustrates an exemplary fabrication process of an FinFET consistent with the disclosed embodiments. FIGS. 7-16 illustrate semiconductor structures corresponding to certain stages of the exemplary fabrication process.

Figure 7:
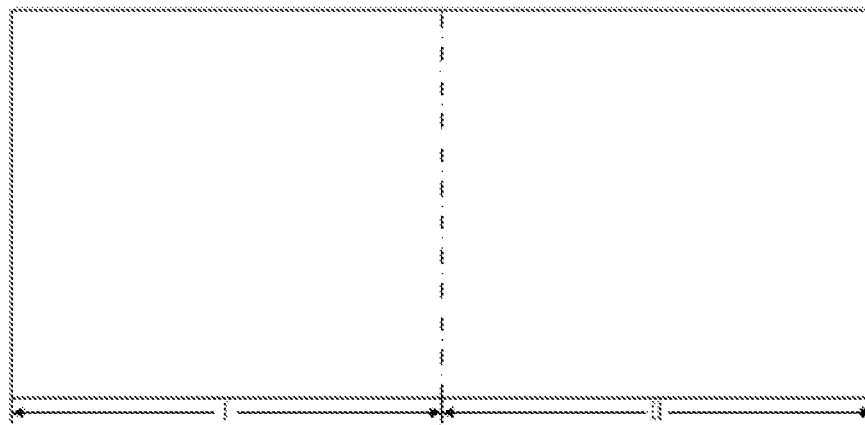
FIGS. 7-16 illustrate semiconductor structures corresponding to certain stages of an exemplary fabrication process of an FinFET structure consistent with the disclosed embodiments.

As shown in FIG. 19, at the beginning of the fabrication process, a base substrate is provided (S101). FIG. 7 illustrates a corresponding semiconductor structure.

As shown in FIG. 7, a base substrate is provided. The base substrate provides a process platform for forming the FinFET structure.

In one embodiment, the base substrate includes a first region I and a second region II. The base substrate in the first region I and the second region II may be used to form different transistors, respectively. The first region I may be used to form a P-type device; and the second region II may be used to form an N-type device.

In some embodiments, the base substrate may only include the region for forming an N-type device, or the region for forming a P-type device.

In one embodiment, the first region I and the second region II are adjacent to each other. In some embodiments, the first region I and the second region II may be isolated.

The base substrate may be made of single crystalline silicon, amorphous silicon, germanium, silicon carbide, gallium arsenide, gallium indium, or silicon germanium, etc. The base substrate may also be a silicon-on-insulator (SOI) substrate, or a germanium-on-insulator (GOI) substrate, etc. In one embodiment, the base substrate is made of single crystalline silicon.

Figure 8:
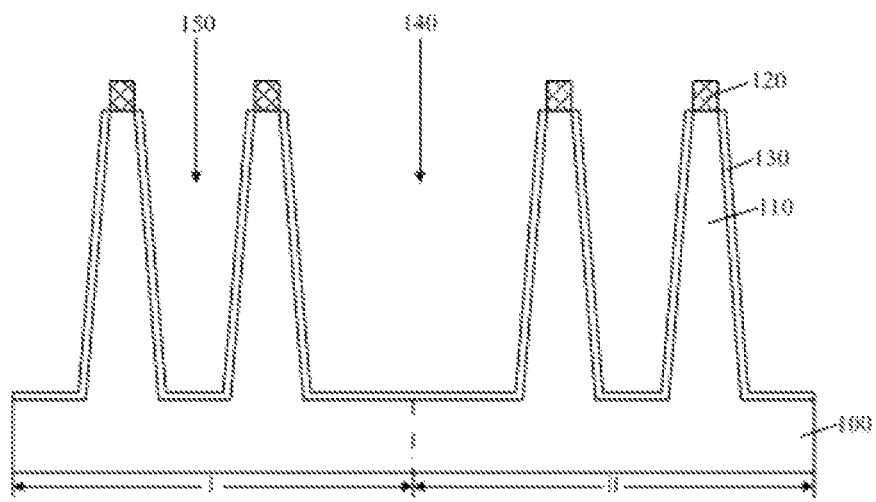

Returning to FIG. 19, after providing the base substrate, a plurality of fins and a semiconductor substrate may be formed (S102). FIG. 8 illustrates a corresponding semiconductor structure.

As shown in FIG. 8, a plurality of fins 110 are formed on a semiconductor substrate 100. The plurality of fins 110 and the semiconductor substrate 100 may be formed by etching the base substrate. First trenches 140 and second trenches 150, i.e., shallow trenches, may be formed between adjacent fins 110. The width of the first trenches 140 and the width of the second trenches 150 may be different; and the width of the first trenches 140 may be greater than the width of the second trenches 150. For illustrative purposes, one first trench 140 and two second trenches 150 are illustrated and described herein. In some embodiments, the first trenches may be more than one.

The first trench 140 may provide a spatial position for subsequently forming a first isolation layer and a second isolation layer. The second trenches 150 may provide a spatial position for subsequently forming the first isolation layer.

Referring to FIG. 8, in one embodiment, the first trench 140 may locate between the adjacent fins 110 at the boundary region between the first region I and the second region II. The second trenches 150 may locate between the adjacent fins 110 in the first region I, or between the adjacent fins 110 in the second region II. The width of the first trench 140 may be greater than the width of the second trenches 150.

In some embodiments, the first trenches and the second trenches may all locate between the fins in the first region, or the fins in the second region. That is, if the base substrate includes only the region for forming the N-type device, the first trenches and the second trenches may all locate between the fins in the N-type device region. Or, if the base substrate includes only the region for forming the P-type device, the first trenches and the second trenches may all locate between the fins in the P-type device region.

In one embodiment, the width of the first trench 140 may be in a range of approximately 80 nm-200 nm. The width of the second trenches 150 may be in a range of approximately 20 nm-80 nm.

Referring to FIG. 8, the process for forming the semiconductor substrate 100 and the plurality of fins 110 may include forming a hard mask layer 120 on the base substrate; and etching the base substrate using the hard mask layer 120 as a mask. Thus, the semiconductor substrate 100 and the plurality of fins 110 may be formed. The gaps between the adjacent fins 110 may be referred to as the first trench 140 and the second trenches 150.

After forming the semiconductor substrate 100 and the plurality of fins 110, an oxide layer 130 may be formed on the surface of the semiconductor substrate 100 between adjacent fins 110 and the side surfaces of fins 110. The oxide layer 130 may be referred to as a liner oxide layer.

Because the fins 110 may be formed by etching the base substrate, the fins 110 may have protruding edges and surface defects. In one embodiment, the oxide layer 130 may be formed by a thermal oxidation process. During the thermal oxidation process, because the surface-to-volume ratio of the protruding edges may be relatively large, the protruding edges may be easily oxidized. After subsequently removing the oxide layer 130, the surface defects of the fins 110 may be removed; and the protruding edges may also be removed. Thus, the surface of the fins 110 may be rounded and smoothed; the crystal quality of the fins 110 may be improved; and the tip-discharging issue may be reduced. Further, the oxide layer 130 may also be able to improve the interface property between the subsequently formed isolation structure and the fins 110.

The thickness of the oxide layer 130 may be any appropriate value. If the oxide layer 130 is too thin, i.e., the protruding edges of the fins 110 and the surface defects of the fins 110 are not completely oxidized to form the oxide layer 130, the protruding edges of the fins 110 and the surface defects of the fins 110 may not be completely removed simultaneously. Thus, the oxide layer 130 may be unable to function to smooth the surfaces of the fins 110; to improve the crystal quality of the fins 110; and to reduce the tip-discharging issue. Further, in one embodiment, the oxide layer 130 may be formed by oxidizing the fins 110, if the oxide layer 130 is too thick, the fins 110 may be overly consumed; and the performance of the transistors may be reduced. Thus, in one embodiment, the thickness of the oxide layer 130 may be in a range of approximately 10 Å-50 Å.

In one embodiment, the fins 110 are made of silicon. Correspondingly, the oxide layer 130 is made of silicon oxide. In some embodiments, the oxide layer may be formed by other appropriate process, such as a chemical vapor deposition (CVD) process, etc.

Figure 9:
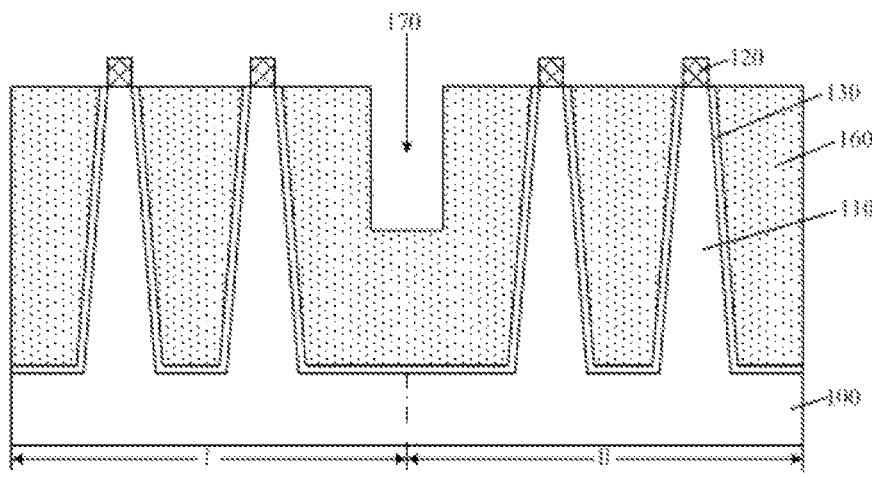

Returning to FIG. 19, after forming the oxide layer, a first isolation layer may be formed (S103). FIG. 9 illustrates a corresponding semiconductor structure.

As shown in FIG. 9, a first isolation layer 160 is formed on the semiconductor substrate 100 exposed by the fins 110. The first isolation layer 160 may form an opening 170 at the first trench 140 (referring to FIG. 8).

Because the width of the first trench 140 may be greater than the width of the second trenches 150, when the second trenches 150 are just filled up with the first isolation layer 160, i.e., the top surface of the first isolation layer 160 at the second trenches 150 levels with the top surfaces of the fins 110, the surface of the first isolation layer 160 at the first trench 140 may be below the top surfaces of the fins 110. Thus, the opening 170 may be formed.

The first isolation layer 160 may be used to subsequently form an isolation structure. The opening 170 may define the spatial position of the subsequently formed second isolation layer.

The first isolation layer 160 may fill the second trenches 150, e.g., the top surface of the first isolation layer 160 in the second trenches may level with the top surface of the fins 110; and the first isolation layer 160 may partially fill the first trench 140, e.g., the top surface of the first isolation layer 160 in the first trench 140 may be below the top surface of the fins 110; and the opening 170 may be formed in the first isolation layer 160 formed in the first trench 140. Thus, the filling amount of the first isolation layer 160 in the first trench 140 may be equal to the filling amount of the first isolation layer 160 in each of the second trenches 150. The thickness difference of the first isolation layer 160 at two sides of each fin 110 may be relatively small. Thus, a foundation for further process may be provided for subsequently reducing the stress in the first isolation layer 160 by a first thermal annealing process.

Various processes may be used to form the first isolation layer 160. In one embodiment, a flowable chemical vapor deposition (FCVD) process or an atomic layer deposition (ALD) process may be used to form the first isolation layer 160.

In one embodiment, an FCVD process is used to form the first isolation layer 160. Specifically, trisilyamine (TSA) and $NH_3$ may be used to form an oxide containing nitrogen bonds and hydrogen bonds, then oxide containing nitrogen bonds and hydrogen bonds may be processed by $O_3$.

Processing the oxide containing nitrogen bonds and hydrogen bonds may remove the nitrogen bonds and hydrogen bonds. Thus, the amount of the nitrogen bonds and hydrogen bonds in the first isolation layer 160 may be decreased. Accordingly, the compactness and the uniformity of the first isolation layer 160 may be increased; and the rate for subsequently removing a partial thickness of the first isolation layer 160 may be easy to control.

The oxide may be one of silicon oxide, and silicon oxynitride, etc. The oxide may also be a low-K dielectric material (i.e., the relative dielectric constant is greater than or equal to 2.5 and smaller than 3.9), or an ultra-low-K dielectric material (i.e., the relative dielectric constant is smaller than 2.5).

In one embodiment, the oxide is silicon oxide. Correspondingly, the first isolation layer 160 is made of silicon oxide.

The first isolation layer 160 may be formed by forming a first isolation film (not shown) on the semiconductor substrate 100 exposed by the fins 110; and performing a hardening thermal annealing process on the first isolation film to form a first isolation material layer (not shown). The first isolation material layer may be used to form the first isolation layer 160 by a patterning process.

The hardening thermal annealing process may be able to increase the compactness and the strength of the first isolation material layer; and increase the compactness and the strength of the subsequently formed isolation structure accordingly. Further, the hardening thermal annealing process may also be able to reduce the stress in the first isolation film. Thus, the deformation possibility of the fins caused by a stress difference generated from the shrinking of the first isolation film may be reduced. Accordingly, the properties of the first isolation material layer may be improved.

To reduce the process steps and the production cost, in one embodiment, the first isolation material layer may be formed on the semiconductor substrate 100 exposed by the fins 110; and the first isolation material layer may be used to form the first isolation layer 160.

During the process for forming the first isolation layer 160, the second trenches 150 may be partially filled, e.g., the top surface of the first isolation layer 160 in the second trenches may be below the top surfaces of the first 110. In some embodiments the second trenches 150 may be completely filled, e.g., the top surface of the isolation layer 160 in the second trenches may level with the top surface of the fins 110. In other embodiments, the first isolation layer 160 may fill the second trenches 150, and the top surface of the first isolation layer 160 in the second trenches may be above the top surfaces of the fins 110. Under each of such three conditions, the thicknesses of the first isolation layer 160 in the first trench 140 and the second trenches 150 may be substantially equal, e.g., may have a relatively small difference. Thus, during the subsequent first thermal annealing process, the difference between the shrinking amounts of the first isolation layer 160 in the first trench 140 and the second trenches 150 may be relatively small. Further, the first thermal annealing process may reduce the stress of the first isolation layer 160. Thus, the deformation possibility of the fins 110 caused by a stress difference generated from the shrinking of the first isolation layer 160 may be reduced.

In one embodiment, the top surface of the first isolation layer 160 in the second trenches levels with the top surfaces of the fins 110. That is, the first isolation layer 160 may fill the second trenches 150. The first isolation layer 160 may partially fill the first trench 140.

In some embodiments, the second trenches may be partially filled. That is, the top surface of the first isolation layer in the second trenches may be below the top surfaces of the fins. In other embodiments, the first isolation layer may fill the first trench; and the top surfaces of the first isolation layer in the second trenches may above the top surfaces of the fins.

Figure 10:
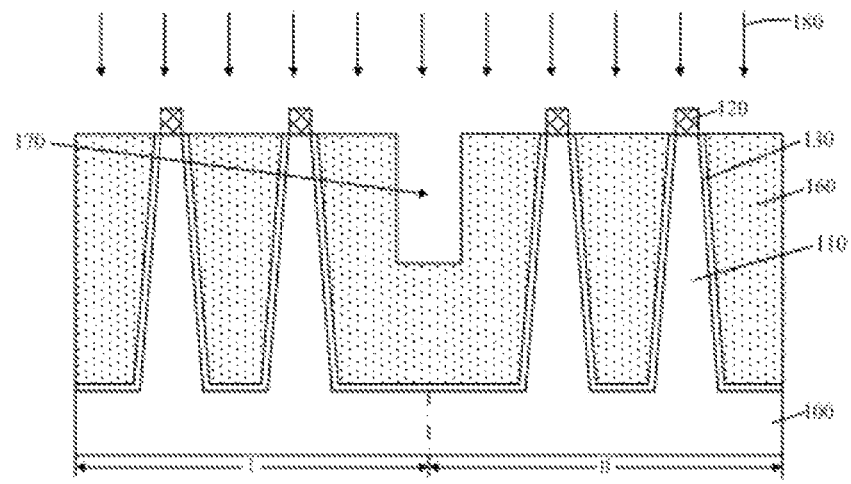

Returning to FIG. 19, after forming the first isolation layer, a first thermal annealing process may be performed (S104). FIG. 10 illustrates a corresponding semiconductor structure.

As shown in FIG. 10, a first thermal annealing process 180 is performed on the first isolation layer 160.

Referring to FIG. 8, because the filling amount difference between the first isolation layer 160 in the first trench 140 and the first isolation layer 160 in the second trench 150 may be relatively small, during the first thermal annealing process 180, the shrinking amount difference between the first isolation layer 160 in the first trench 140 and the first isolation layer 160 in the second trench 150 may also be relatively small. Further, the first thermal annealing process 180 may reduce the stress in the first isolation layer 160; and improve the properties of the first isolation material layer 160. Thus, the deformation possibility of the fins 110 caused by the stress difference generated by the shrinking of the first isolation layer 160 may be reduced. Accordingly, the performance of the transistors may be improved.

Further, the first thermal annealing process 180 may be able to further increase the compactness and uniformity of the first isolation layer 160. Thus, the removing rate of the subsequent process for removing a partial thickness of the first isolation layer 160 may be easy to control.

The first thermal annealing process 180 may be a furnace thermal annealing process, a heat thermal annealing process, a rapid thermal annealing process, or a laser thermal annealing process, etc. The gas environment of the first thermal annealing process 180 may include Ar, $N_2$, or He, etc. Under such a gas environment, the oxidation possibility of the transistors during the first thermal annealing process 180 may be reduced.

The temperature and the time of the first thermal annealing process 180 may be controlled in an appropriate range.

If the temperature of the first thermal annealing process 180 is too high, the thermal budget and the production cost of the transistors may be increased; and it may degrade the performance of the transistors. If the temperature of the first thermal annealing process 180 is too low, it may be unable to reduce the stress in the first isolation layer 160. Thus, the temperature of the first thermal annealing process 180 may be in a range of approximately 500° C.-800° C.

If the time of the thermal annealing process 180 is too long, the thermal budget and the production cost of the transistors may be increased; and it may degrade the performance of the transistors. If the time of the first thermal annealing process 180 is too short, it may be unable to reduce the stress in the first isolation layer 160. Thus, the time of the first thermal annealing process 180 may be in a range of approximately 5 mins-60 mins.

Figure 11:
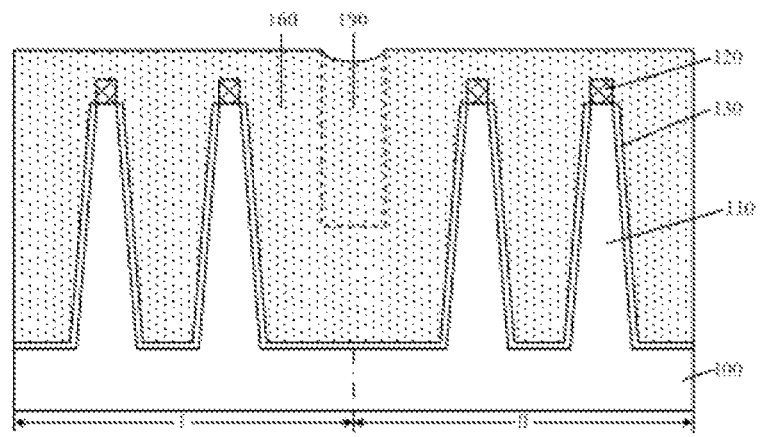

Returning to FIG. 19, after the first thermal annealing process, a second isolation layer may be formed (S105). FIG. 11 illustrates a corresponding semiconductor structure.

As shown in FIG. 11, a second isolation layer 190 is formed. The second isolation layer 190 may fill the opening 170; and may cover the first isolation layer 160. The second isolation layer 190 may have a concave-shaped top surface.

Various processes may be used to form the second isolation layer 190. In one embodiment, an FCVD process, or an ALD process may be used to form the second isolation layer 190.

In one embodiment, an FCVD process is used to form the second isolation layer 190. Specifically, trisilyamine (TSA) and $NH_3$ may be used to form an oxide containing nitrogen bonds and hydrogen bonds, then the oxide containing nitrogen bonds and hydrogen bonds may be processed by $O_3$.

Processing the oxide containing nitrogen bonds and hydrogen bonds may remove the nitrogen bonds and hydrogen bonds in the oxide. Thus, the amount of the nitrogen bonds and the hydrogen bonds in the second isolation layer 190 may be decreased. Accordingly, the compactness and the uniformity of the second isolation layer 190 may be increased; and the removing rate of the subsequent process for removing a partial thickness of the second isolation layer 190 may be easy to control.

The oxide may be one of silicon oxide and silicon oxynitride. The oxide may also be low-K dielectric material (i.e., the relative dielectric constant is greater than or equal to 2.5 and smaller than 3.9), or ultra-low-K dielectric material (i.e., the relative dielectric constant is smaller than 2.5).

In one embodiment, the oxide is silicon oxide. Correspondingly, the second isolation layer 190 is made of silicon oxide.

Figure 12:
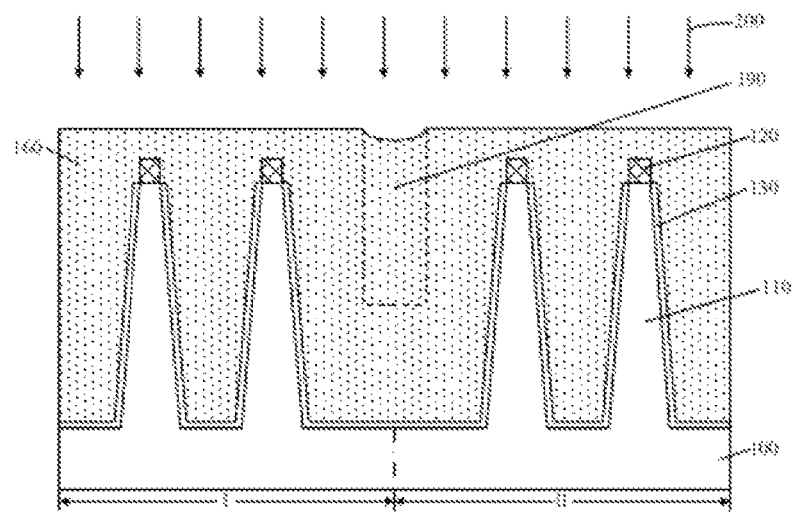

Returning to FIG. 12, after forming the second isolation layer 190, a second thermal annealing process may be performed (S106). FIG. 12 illustrates a corresponding semiconductor structure.

As shown in FIG. 12, a second thermal annealing process 200 is performed on the second isolation layer 190. The second thermal annealing process 200 may be able to increase the compactness and uniformity of the second isolation layer 190. Accordingly, the compactness and the uniformity of the subsequently formed isolation structure may be increased.

Further, the second thermal annealing process 200 may reduce the stress in the second isolation layer 190. Thus, the deformation possibility of the fins 110 caused by the stress difference generated by the shrinking of the second isolation layer 190 may be reduced. Thus, the properties of the second isolation layer 190 may be improved.

The second thermal annealing process 200 may be a furnace thermal annealing process, a heat thermal annealing process, a rapid thermal annealing process, or a laser thermal annealing process, etc. The gas environment of the second thermal annealing process 200 may include Ar, $N_2$, or He, etc. Under such a gas environment, the oxidation possibility of the transistors during the second thermal annealing process 200 may be reduced.

The temperature and the time of the second thermal annealing process 200 may be controlled in an appropriate range.

If the temperature of the second thermal annealing process 200 is too high, the thermal budget and the production cost of the transistors may be increased; and it may degrade the performance of the transistors. If the temperature of the second thermal annealing process 200 is too low, it may be unable to reduce the stress in the second isolation layer 190. Thus, the temperature of the second thermal annealing process 200 may be in a range of approximately 500° C.-800° C.

If the time of the second thermal annealing process 200 is too long, the thermal budget and the production cost of the transistors may be increased; and it may degrade the performance of the transistors. If the time of the second thermal annealing process 200 is too short, it may be unable to reduce the stress in the second isolation layer 190. Thus, the time of the second thermal annealing process 200 may be in a range of approximately 5 mins-60 mins.

Figure 13:
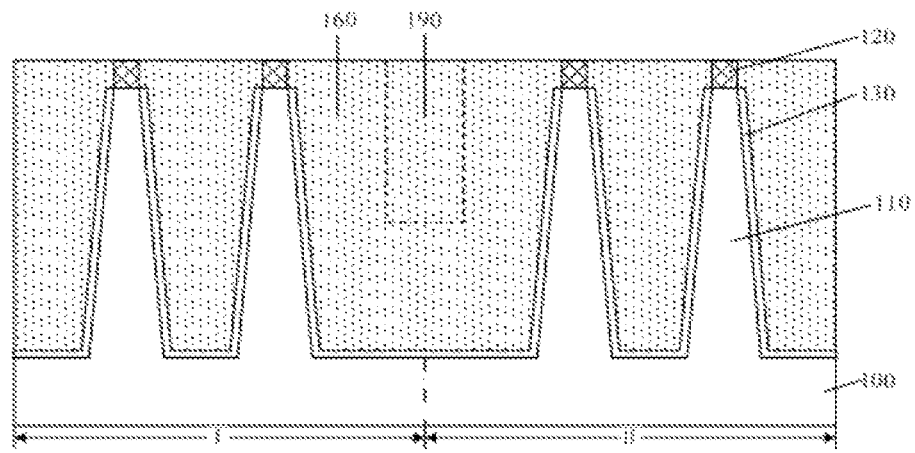

Returning to FIG. 19, after performing the second thermal annealing process, a planarization process may be performed (S107). FIG. 13 illustrates a corresponding semiconductor structure.

As shown in FIG. 13, a planarization process (not shown) is performed on the first isolation layer 160 and the second isolation layer 190 using the top surface of the hard mask layer 120 as a stop layer. The planarization process may reduce the removing amount of the subsequent process for removing the partial thickness of the first isolation layer 160 and the second isolation layer 190. Thus, the process difficulty of the subsequent process may be reduced.

During the planarization process, the hard mask layer 120 on the surfaces of the fins 110 may be able to protect the fins 110.

The planarization process may be any appropriate process. In one embodiment, the planarization process is a chemical mechanical polishing (CMP) process.

Figure 14:
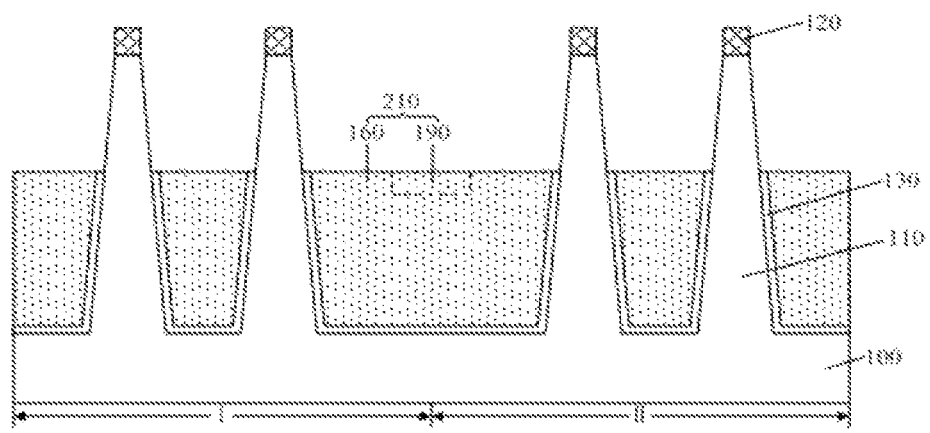

Returning to FIG. 19, after the planarization process, an isolation structure may be formed (S108). FIG. 14 illustrates a corresponding semiconductor structure.

As shown in FIG. 14, an isolation structure 210 is formed. The isolation structure may be formed by removing a partial thickness of the first isolation layer 160 and a partial thickness of the second isolation layer 190. The top surface of the isolation structure 210 may be below the top surfaces of the fins 110.

The isolation structure 210 may be used to electrically isolate adjacent fins 110; and electrically isolate the first region I and the second region II.

Various processes may be used to remove the partial thickness of the first isolation layer 160 and the partial thickness of the second isolation layer 190. In one embodiment, a SiCoNi etching process is used to remove the partial thickness of the first isolation layer 160 and the partial thickness of the second isolation layer 190. The SiCoNi process may include generating an etching gas using He as a diluting gas and $NF_3$ and $NH_3$ as reaction gases; using the etching gas to remove the partial thickness of the first isolation layer 160 and the partial thickness of the second isolation layer 190 to form by-products; and performing an thermal annealing process to sublimate and decompose the by-products to gaseous products; and pumping out the gaseous products.

Specifically, the flow rate of He in the SiCoNi process may be in a range of approximately 100 sccm-1000 sccm. The flow rate of $NF_3$ in the SiCoNi process may be in range of approximately 500 sccm-3000 sccm. The flow rate of $NH_3$ in the SiCoNi process may be in a range of approximately 20 sccm-200 sccm. The pressure of the reaction chamber of the SiCoNi process may be in a range of approximately 0.1 Torr-5 Torr. The time of the SiCoNi process may be in a range of approximately 20 s-200 s.

During the process for removing the partial thickness of the first isolation layer 160 and the partial thickness of the second isolation layer 190, a partial thickness of the oxide layer 130 may also be removed to cause the top surface of the remaining oxide layer 130 to level with the top surface of the isolation structure 210.

In one embodiment, because the first isolation layer 160 and the second isolation layer 190 are made of silicon dioxide. Thus, the isolation structure 210 may also be made of silicon dioxide.

In one embodiment, the isolation structure 210 may be a shallow trench isolation (STI) structure.

Figure 15:
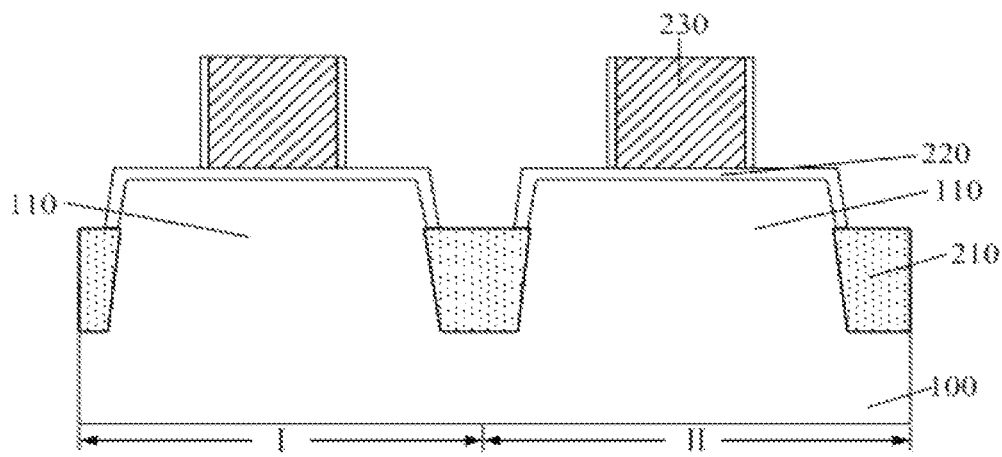

Returning to FIG. 19, after forming the isolation structure 210, a gate structure may be formed (S109). FIG. 15 illustrates a corresponding semiconductor structure.

As shown in FIG. 15, a gate structure is formed over the semiconductor substrate 100. The gate structure may be across the fins 110 by covering portions of the side and top surfaces of the fins 110.

In one embodiment, the gate structure may include a gate dielectric layer 220 and a gate electrode layer 230 on the gate dielectric layer 220. The gate dielectric layer 220 may be made of a high-K (i.e., the relative dielectric constant is greater than 3.9) dielectric material. The gate electrode layer 230 may be made of polysilicon, or metal material. The metal material may include one or more of Ti, Ta, TiN, TaN, TiAl, TiAlN, Cu, Al, W, Ag, and Au, etc.

An interface layer (not shown) may be formed between the gate dielectric layer 220 and the fins 110. The interface layer may be made of silicon oxide.

The process for forming the gate structure may include forming a gate dielectric film over the isolation structure 210 and across the fins 110 by covering the top and side surfaces of the fins 110; forming a gate electrode film on the gate dielectric film; forming a patterned mask layer (not shown) defining the patterns of the gate structure on the gate electrode film; patterning the gate electrode film and the gate dielectric film using the mask layer as a patterning mask to form the gate dielectric layer 220 and the gate electrode layer 230; and removing the patterned mask layer.

In some other embodiments, the gate structure may be a dummy gate structure. The dummy gate structure may be removed during the subsequent processes, then, the actual gate structure of the transistors may formed at the position of the dummy gate structure. The dummy gate structure may include a dummy gate dielectric layer and a dummy gate electrode layer on the dummy gate dielectric layer. The dummy gate dielectric layer may be made of silicon oxide. The dummy gate electrode layer may be made of silicon oxide, silicon nitride, silicon oxynitride, silicon carbide, silicon carbonitride, silicon oxycarbonitride, or amorphous carbon, etc.

After forming the gate structure across the fins 110, sidewall spacers (not shown) may be formed on the side surfaces of the gate structure. The sidewall spacers may be used to define the relative positions between the doped source/drain regions and the gate structure. Further, the sidewall spacers may protect the gate structure during the subsequent processes.

The sidewall spacers may be made of silicon oxide, silicon nitride, silicon carbide, silicon carbon nitride, silicon carbonoxynitride, silicon oxynitride, boron nitride, or boron carbonitride, etc. In one embodiment, the sidewall spacers are made of silicon nitride.

Figure 16:
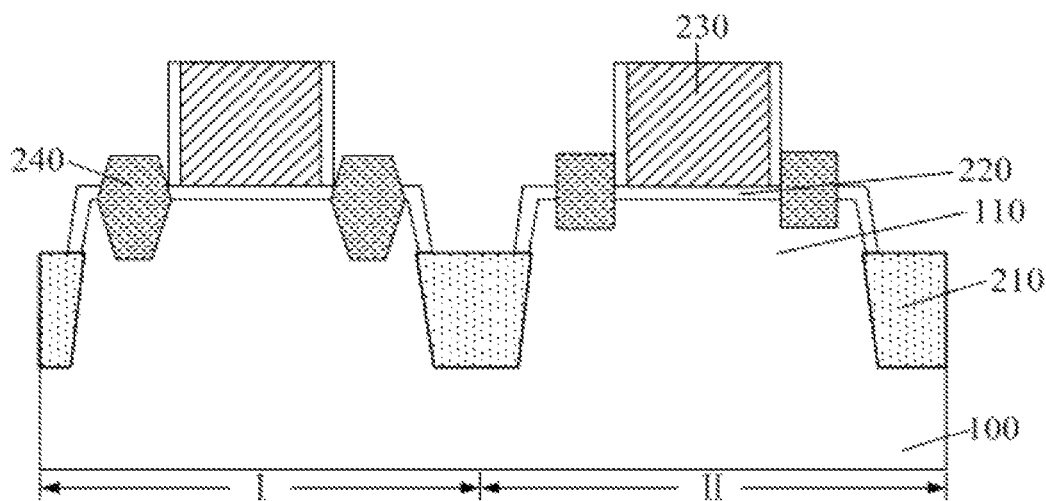

Returning to FIG. 19, after forming the gate structure, doped source/drain regions may be formed (S110). FIG. 16 illustrates a corresponding semiconductor structure.

As shown in FIG. 16, doped source/drain regions 240 may be formed in the fins 110 at two sides of the gate structure. Because the finally formed transistors are FinFETs, the doped source/drain regions 240 may be raised doped source/drain regions.

Specifically, the process for forming the doped source/drain regions 240 may include forming trenches in the substrate 100 at two sides of the gate structure; forming a stress layer in the trenches and in-situ doping the stress layer during the process for forming the stress layer to form initial source/drain regions; and performing an ion implantation process to the initial source/drain regions to form doped the source/drain regions 240.

In one embodiment, the first region I is used to form the P-type device. Correspondingly, the stress layer may be a "Σ"-shaped stress layer. The "Σ"-shaped stress layer may be made of SiGe, SiB, or SiGeB, etc. The "Σ"-shaped stress layer may provide a compressive stress to the channel region of the P-type device; and the carrier mobility of the P-type devices may be increased. The second region II may be used to form the N-type device. Correspondingly, the stress layer may be a "U"-shaped stress layer. The "U"-shaped stress layer may be made of SiC, SiP or SiCP, etc. The "U"-shaped stress layer may provide a tensile stress to the channel region of the N-type device; and the carrier mobility of the N-type device may be increased.

In some embodiments, the first region and the second region may be both used to form N-type devices. Correspondingly, the stress layers in the two regions may be both "U"-shaped stress layers. In other embodiments, the first region and the second region may be both used to form P-type devices. Correspondingly, the stress layers in the two regions may be both "Σ"-shaped stress layers.

In the disclosed method, a plurality of fins and a semiconductor substrate may be formed by etching a base substrate. First trenches and second trenches may be formed among the plurality of fins. The width of the first trench may be greater than the width of the second trench. Then, a first isolation layer may be formed on the semiconductor substrate exposed by the fins; and the first isolation layer may form an opening at each of the first trenches. Then, a first thermal annealing process may be performed on the first isolation layer; and a second isolation layer and an isolation structure may be formed. Because the filling quantity of the first isolation layer in the first trench and the filling quantity of the first isolation layer in the second trench may be substantially equivalent. Thus, during the first thermal annealing process, the shrinking quantity of the first isolation layer in the first trench may be substantially equal to the shrinking quantity of the first isolation layer in the second trench; and the shrinking quantity of the first isolation layer in the first trench and the shrinking quantity of the first isolation layer in the second trench may have a substantially small difference. Further, the first thermal annealing process may reduce the stress in the first isolation layer; and improve the properties of the first isolation layer. Thus, the deformation possibility of the fins caused by the stress difference generated by the shrinking of the first isolation layer may be reduced; and the performance of the transistors may be improved.

Figure 17:
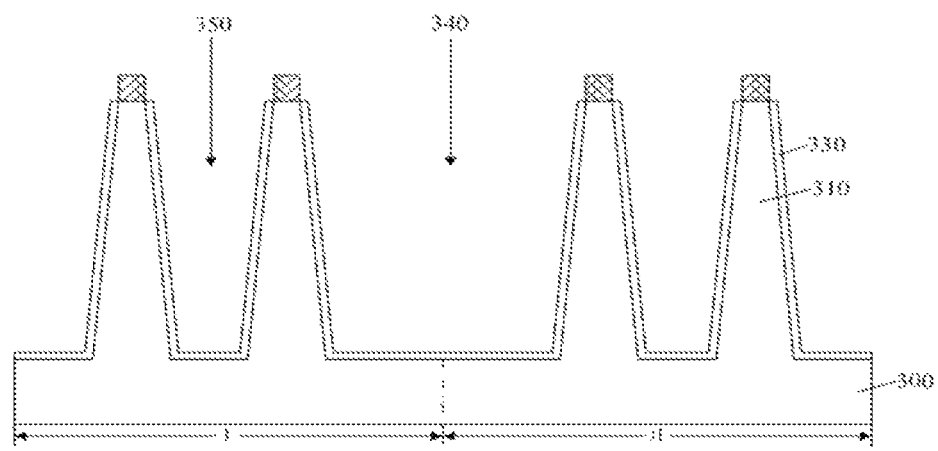
FIGS. 17-18 illustrate an exemplary FinFET structure consistent with the disclosed embodiments.
Figure 18:
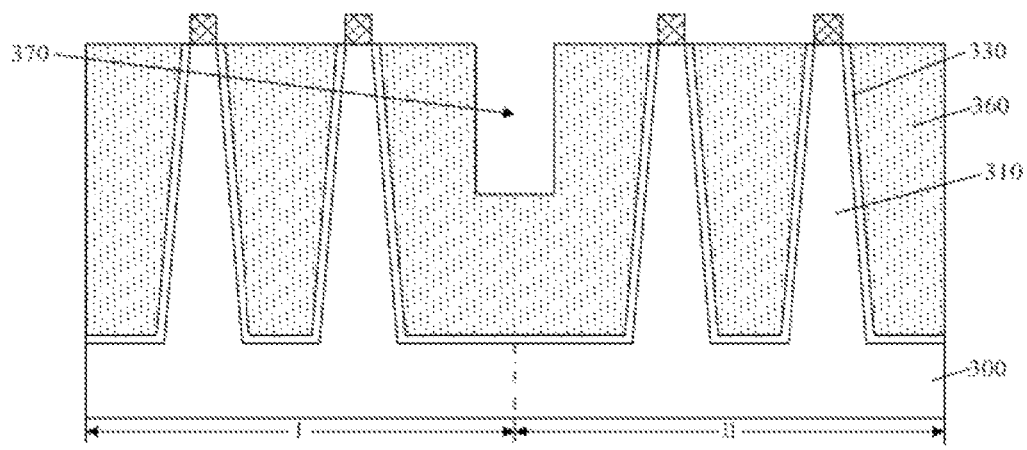

The present disclosure also provides an FinFET. FIGS. 17-18 illustrate an exemplary FinFET consistent with the disclosed embodiments. For illustrative purposes, the isolation structure of the FinFET is omitted in FIG. 17. FIG. 18 illustrates the FinFET based on the structure illustrated in FIG. 17 with the isolation layer.

As shown in FIGS. 17-18, the FinFET includes a semiconductor substrate 300 and a plurality of fins 310 on the semiconductor substrate 300. First trenches 340 and second trenches 350 (referring to FIG. 17) may be formed between adjacent fins 310. The width of the first trench 340 may be greater than the width of the second trench 350. The FinFET may also include a first isolation layer 360 formed on the semiconductor substrate 300 exposed by the plurality of fins 310. The first isolation layer 360 may form an opening 370 at the first trench 340 (referring to FIG. 17).

The semiconductor substrate 300 may provide a process platform for the subsequent semiconductor processes.

In one embodiment, the semiconductor substrate 300 includes a first region I and a second region II. The first region I and the second region II may have different transistors. The first region I may have a P-type device; and the second region II may have an N-type device.

In some embodiments, the semiconductor substrate may only include N-type device regions, or may only include P-type device regions.

In one embodiment, the first region I and the second region II may be adjacent to each other. In some embodiments, the first region I and the second region II may be isolated.

The semiconductor substrate 300 may be made of single crystalline silicon, amorphous silicon, polysilicon, germanium, silicon germanium, silicon carbide, gallium arsenide, indium gallium, silicon germanium compound, or other semiconductor materials. The semiconductor substrate 300 may also be a silicon-on-insulator (SOI) substrate, or a germanium-on-insulator (GOI) substrate, etc. In one embodiment, the semiconductor substrate 300 is made of single crystalline silicon.

The fins 310 may be made of a material identical to the material of the semiconductor substrate 300. In one embodiment, the fins 310 are made of silicon.

In one embodiment, as shown in FIG. 17, the first trench 340 is between the fins 310 at the boundary region between the first region I and the second region II; and the second trenches 350 may be between the fins 310 in the first region I, or between the fins 310 in the second region II. The width of the first trench 340 may be greater than the width of the second trench 350.

In some embodiments, the first trenches and the second trenches may all be between the fins in the first region, or between the fins in the second region. For example, if the semiconductor substrate only includes the N-type device region, the first trenches and the second trenches may all be between the fins in the N-type region. If the semiconductor substrate only includes the P-type device region, the first trenches and the second trenches may be all between the fins in the P-type region.

In one embodiment, the width of the first trench 340 may be in a range of approximately 80 nm-200 nm. The width of the second trench 350 may be in a range of approximately 20 nm-80 nm.

In one embodiment, the FinFET structure may also include an oxide layer 330, i.e., a liner oxide layer, on the surface of the semiconductor substrate 300 among the fins 310 and the side surfaces of the fins 310.

Because the fins 310 may be formed by an etching process, the fins 310 may have protruding edges; and may have surface defects. The oxide layer 330 may often be formed by an oxidation process. During the oxidation process, because the protruding edges may have relatively large surface-to-volume ratios; and may be easily oxidized, the protruding edges and the surface defects may be easily removed during the subsequent process for removing the oxide layer 330. Thus, the surfaces of the fins 310 may be rounded and smoothed; the quality of the crystal lattice of the fins 310 may be improved; and the tip-discharging issue of the fins 310 may be reduced. Further, the oxide layer 330 may be able to increase the interface properties between the isolation layer 360 and the fins 310.

In one embodiment, the oxide layer 330 may be formed by oxidizing the fins 310. Thus, the oxide layer 330 may be made of silicon oxide.

The first isolation layer 360 may be a portion of the isolation structure of the FinFET.

In one embodiment, the first isolation layer 360 may partially fill the second trenches 350. In some embodiments, the first isolation layer 360 may completely fill the second trenches 350, i.e., the top surface of the first isolation layer 360 levels with the top surfaces of the fins 310. In other embodiments, the first isolation layer 360 may fill the second trenches 360; and the top surface of the first isolation layer 360 may be above the top surfaces of the fins 310.

In one embodiment, the first isolation layer 360 completely fills the second trenches 350. Specifically, the top surface of the first isolation layer 360 in the second trenches 350 may level with the top surfaces of the fins 310.

The first isolation layer 360 may be made of silicon oxide, silicon nitride, or silicon oxynitride, etc. The first isolation layer 360 may also be made of low-K (the relative dielectric constant is greater than, or equal to 2.5 and smaller than 3.9) dielectric material, or ultra-low-K (the relative dielectric constant is smaller than 2.5). In one embodiment, the first isolation layer 360 is made of silicon oxide.

In one embodiment, the first isolation layer 360 may have an opening 370 at the first trench 340. When the first isolation layer 360 is used to form the isolation structure of the FinFET structure. The first isolation layer 360 may need to go through a thermal annealing process. Because the first isolation layer 360 may have an opening 370 at the first trench 340, the opening 370 may allow the filling quantity of the first isolation layer 360 in the first trench 340 to be substantially equivalent to the filling quantity of the first isolation layer 360 in the second trench 350. Thus, the thickness difference between the first isolation layer 360 at two sides of each fin 310 may be relatively small. Further, the thermal annealing process may reduce the stress in the first isolation layer 360; and improve the properties of the first isolation layer 360. Thus, the deformation possibility of the fins 310 caused by the stress difference of the first isolation layer 360 generated by the shrinking of the first isolation layer 360 may be reduced. Accordingly, the performance of the transistors may be improved.

Comparing with the existing fabrication technologies of an FinFET structure, the disclosed methods may having following advantages.

For example, in the disclosed fabrication method of an FinFET, a semiconductor substrate and a plurality of fins may be formed by etching a base substrate. First trenches and second trenches may be formed between adjacent fins. The width of the first trench may be greater than the width of the second trench. Then, a first isolation layer may be formed on the surface of the semiconductor substrate exposed by the fins. The first isolation layer may form an opening at the first trench. Further, a first thermal annealing process may be performed on the first isolation layer; and a second isolation layer and an isolation structure may be formed. Because the filling quantity of the first isolation layer in the first trench may be substantially equivalent to the filling quantity of the first isolation layer in the second trench. Thus, the thickness difference of the first isolation layer at two sides of each fin may be relatively small. Accordingly, the shrinkage difference between the first isolation layer in the first trench and the first isolation layer in the second trench may be relatively small during the first thermal annealing process. Further, the first thermal annealing process may be able to reduce the stress in the first isolation layer; and improve the properties of the first isolation layer. Thus, the deformation possibility of the fins caused by the stress difference of the first isolation layer generated by the shrinking of the first isolation layer may be reduced. Accordingly, the performance of the transistors may be improved.

The disclosed FinFET may include a semiconductor substrate and a plurality of fins on the semiconductor substrate. First trenches and second trenches may be formed by adjacent fins. The width of the first trench may be smaller than the width of the second trench. The FinFET may also include a first isolation layer on the semiconductor substrate exposed by the fins and the first trench. When the first isolation layer is used to form an isolation structure of the FinFET structure, the first isolation layer may need go through a first thermal annealing process. Because the first isolation layer may have the opening at the first trench, the filling quantity of the first isolation layer in the first trench may be substantially equivalent to the filling quantity of the first isolation layer in the second trench. Thus, the thickness difference between the first isolation layer at two sides of each fin may be relatively small. Accordingly, the shrinkage difference between the first isolation layer in the first trench and the isolation layer in the second trench may be relatively small during the first thermal annealing process. Further, the first thermal annealing process may reduce the stress in the first isolation layer; and improve the properties of the first isolation layer. Thus, the deformation possibility of the fins caused by the stress difference of the first isolation layer generated by the shrinking of the first isolation layer may be reduced. Accordingly, the performance of the transistors may be improved.

The above detailed descriptions only illustrate certain exemplary embodiments of the present disclosure, and are not intended to limit the scope of the present disclosure. Those skilled in the art can understand the specification as whole and technical features in the various embodiments can be combined into other embodiments understandable to those persons of ordinary skill in the art. Any equivalent or modification thereof, without departing from the spirit and principle of the present disclosure, falls within the true scope of the present disclosure.

What is claimed is:

1. A method for fabricating a fin field-effect transistor (FinFET) structure, comprising:
   forming a semiconductor substrate and a plurality of fins by etching a base substrate, wherein first trenches and second trenches are formed between adjacent fins, and a width of the first trenches is greater than a width of the second trenches;
   forming a first isolation layer on a surface of the semiconductor substrate exposed by the fins and on side surfaces of the fins, wherein the first isolation layer in the first trench contains an opening and has a thickness of the first isolation layer on the surface of the semiconductor substrate and on the side surfaces of the fins in the first trench substantially equals a thickness of the first isolation layer in the second trenches, a volume of the first isolation layer in the first trench equals a volume of the first isolation layer in each of the second trenches, and the first isolation layer in the first trench completely covers the surface of the semiconductor substrate exposed by the fins and the side surfaces of the fins;
   performing a first thermal annealing process on the first isolation layer;
   forming a second isolation layer to fill the opening and cover the first isolation layer, wherein the second isolation layer has a concave-shaped top surface in the opening;
   performing a second thermal annealing process on the second isolation layer;
   after performing the second thermal annealing process, removing a partial thickness of the first isolation layer and a partial thickness of the second layer to form an isolation structure;
   forming a gate structure across the plurality of fins by covering side and top surfaces of the plurality of fins; and
   forming doped source/drain regions in the fins at two sides of the gate structure.

2. The method according to claim 1, wherein:
   the first thermal annealing process is one of a furnace thermal annealing process, a rapid thermal annealing process, a heat thermal annealing process, a spike thermal annealing process and a laser thermal annealing process.

3. The method according to claim 1, wherein:
   a gas environment of the first thermal annealing process includes one of Ar, $N_2$ and He;
   a temperature of the first thermal annealing process is in a range of approximately 500° C.-800° C.; and
   a time of the first thermal annealing process is in a range approximately 5 mins-60 mins.

4. The method according to claim 1, wherein forming the first isolation layer comprises:
   forming at least one first isolation film on the surface of the semiconductor substrate exposed by the plurality of fins and the side surfaces of the fins;
   performing a hardening thermal annealing process to the at least one first isolation film; and
   patterning the at least one first isolation film to form the first isolation layer.

5. The method according to claim 4, further comprising:
   forming a first isolation material film used to form the first isolation film on the semiconductor substrate exposed by the plurality of fins and the side surfaces of the fins.

6. The method according to claim 1, wherein:
   the first isolation layer fills the second trenches.

7. The method according to claim 1, wherein:
   the second thermal annealing process is one of a furnace thermal annealing process, a rapid thermal annealing process, a heat thermal annealing process, a spike thermal annealing process and a laser thermal annealing process.

8. The method according to claim 1, wherein:
   a gas environment of the second thermal annealing process includes one of Ar, $N_2$ and He;
   a temperature of the second thermal annealing process is in a range of approximately 500° C.-800° C.; and
   a time of the second thermal annealing process is in a range approximately 5 mins-60 mins.

9. The method according to claim 1, wherein:
   each of the first isolation layer and the second isolation layer is formed by one of a flowable chemical vapor deposition process and an atomic layer deposition process.

10. The method according to claim 9, wherein forming the first isolation layer and the second isolation layer comprises:
    forming an oxide containing nitrogen bonds and hydrogen bond using trisilyamine (TSA) and $NH_3$ as precursors; and
    processing the oxide containing nitrogen bonds and hydrogen bonds using $O_3$.

11. The method according to claim 10, wherein:
    the oxide containing nitrogen bonds and hydrogen bonds is silicon dioxide.

12. The method according to claim 1, wherein:
    a width the first trench is in a range of approximately 80 nm-200 nm; and
    a width of the second trench is in a range of approximately 20 nm-80 nm.

13. The method according to claim 1, wherein:
    the base substrate includes a first region and a second region, used for forming different transistors;
    the first trenches are between adjacent fins at a boundary region between the first region and the second region; and
    the second trenches are between adjacent fins in the first region or adjacent fins in the second region.

14. The method according to claim 1, wherein forming the semiconductor substrate and the plurality of fins by etching the base substrate comprises:
    providing the base substrate;
    forming a hard mask layer on the base substrate; and
    etching the base substrate using the hard mask layer as a mask.

15. The method according to claim 14, before removing the partial thickness of the first isolation layer and the partial thickness of the second isolation layer and after forming the second isolation layer, further comprising:
    performing a planarization process on the first isolation layer and the second isolation layer using the hard mask layer as a stop layer.

16. The method according to claim 1, wherein:
    a thickness of the first isolation layer in the first trench equals a thickness of the first isolation layer in the second trenches.

* * * * *